(12) United States Patent
Xie et al.

(10) Patent No.: US 10,840,329 B1
(45) Date of Patent: Nov. 17, 2020

(54) NANOSHEET TRANSISTOR HAVING IMPROVED BOTTOM ISOLATION

(71) Applicant: International Business Machines Corporation, Armonk, NY (US)

(72) Inventors: Ruilong Xie, Niskayuna, NY (US); Kangguo Cheng, Schenectady, NY (US); Chun-Chen Yeh, Danbury, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/406,395

(22) Filed: May 8, 2019

(51) Int. Cl.
| | |
|---|---|
| H01L 29/06 | (2006.01) |
| H01L 29/66 | (2006.01) |
| H01L 29/165 | (2006.01) |
| H01L 29/78 | (2006.01) |
| H01L 21/02 | (2006.01) |
| H01L 21/8234 | (2006.01) |
| H01L 27/088 | (2006.01) |

(52) U.S. Cl.
CPC .... *H01L 29/0649* (2013.01); *H01L 21/02532* (2013.01); *H01L 21/02603* (2013.01); *H01L 21/823412* (2013.01); *H01L 21/823431* (2013.01); *H01L 21/823481* (2013.01); *H01L 27/0886* (2013.01); *H01L 29/0673* (2013.01); *H01L 29/165* (2013.01); *H01L 29/6681* (2013.01); *H01L 29/785* (2013.01)

(58) Field of Classification Search
None
See application file for complete search history.

(56) References Cited

U.S. PATENT DOCUMENTS

| | | |
|---|---|---|
| 9,620,590 B1 | 4/2017 | Bergendahl et al. |
| 9,741,792 B2 | 8/2017 | Cheng et al. |
| 9,881,998 B1 | 1/2018 | Cheng et al. |
| 9,947,804 B1 | 4/2018 | Frougier et al. |
| 9,984,936 B1 | 5/2018 | Xie et al. |
| 2016/0071729 A1 | 3/2016 | Hatcher et al. |
| 2016/0118472 A1 | 4/2016 | Qi |

(Continued)

OTHER PUBLICATIONS

Loubet et al., "Stacked Nanosheet Gate-All-Around Transistor to Enable Scaling Beyond FinFET", 2017 Symposium on VLSI Technology Digest of Technical Papers, pp. T230-T231.

*Primary Examiner* — Alexander G Ghyka
(74) *Attorney, Agent, or Firm* — Cantor Colburn LLP

(57) ABSTRACT

Embodiments of the invention are directed to a method that includes forming a first sacrificial nanosheet over a substrate and forming a first nanosheet stack over the first sacrificial nanosheet. A cavity is formed under the first nanosheet stack by removing at least a first portion of the first sacrificial nanosheet and leaving a second portion of the first sacrificial nanosheet. An isolation material is deposited within the cavity to form a first isolation region. A portion of the first nanosheet stack that is above the second portion of the first sacrificial nanosheet is removed to separate the first nanosheet stack into a second nanosheet stack and a third nanosheet stack. The second portion of the first sacrificial nanosheet is replaced with the isolation material to form a second isolation region. A bottom isolation region includes the first isolation region and the second isolation region.

17 Claims, 11 Drawing Sheets

(56) References Cited

U.S. PATENT DOCUMENTS

| | | |
|---|---|---|
| 2018/0219064 A1 | 8/2018 | Cheng et al. |
| 2018/0261670 A1 | 9/2018 | Yeung et al. |
| 2019/0157420 A1* | 5/2019 | Cheng ............... H01L 29/66772 |
| 2019/0296106 A1* | 9/2019 | Ando ................ H01L 21/02433 |
| 2019/0393307 A1* | 12/2019 | Reznicek .......... H01L 29/42392 |
| 2020/0020768 A1* | 1/2020 | Lee .................... H01L 29/0653 |
| 2020/0135581 A1* | 4/2020 | Chang ................. H01L 29/785 |
| 2020/0144388 A1* | 5/2020 | Xie .................... H01L 29/4908 |

* cited by examiner

NANOSHEET TRANSISTOR HAVING IMPROVED BOTTOM ISOLATION

BACKGROUND

The present invention relates in general to fabrication methods and resulting structures for semiconductor devices. More specifically, the present invention relates to fabrication methods and resulting structures for nanosheet transistors having an improved bottom isolation region.

In contemporary semiconductor device fabrication processes, a large number of semiconductor devices, such as n-type field effect transistors (nFETs) and p-type field effect transistors (pFETs), are fabricated on a single wafer. Non-planar transistor device architectures (e.g., fin-type FETs (FinFETs) and nanosheet FETs) can provide increased device density and increased performance over planar transistors. For example, nanosheet transistors, in contrast to conventional planar FETs, include a gate stack that wraps around the full perimeter of multiple stacked nanosheet channel regions for a reduced device footprint and improved control of channel current flow. Nanosheet transistors also enable full depletion in the nanosheet channel regions and reduce short-channel effects.

SUMMARY

Embodiments of the invention are directed to a method of performing fabrication operations to form nanosheet field effect transistor (FET) devices having a bottom isolation region under the nanosheet FET devices. The fabrication operations include forming a first sacrificial nanosheet over a substrate and forming a first nanosheet stack over the first sacrificial nanosheet. A cavity is formed under the first nanosheet stack by removing at least a first portion of the first sacrificial nanosheet and leaving a second portion of the first sacrificial nanosheet. An isolation material is deposited within the cavity to form a first isolation region. A portion of the first nanosheet stack that is above the second portion of the first sacrificial nanosheet is removed to separate the first nanosheet stack into a second nanosheet stack and a third nanosheet stack. The second portion of the first sacrificial nanosheet is replaced with the isolation material to form a second isolation region. A first nanosheet FET is formed from the second nanosheet stack, and a second nanosheet FET is formed from the third nanosheet stack. The nanosheet FET devices include the first nanosheet FET and the second nanosheet FET, and the bottom isolation region includes the first isolation region and the second isolation region.

Embodiments of the invention are directed to a method of performing fabrication operations to form nanosheet FET devices having a bottom isolation region under the nanosheet FET devices. The fabrication operations include forming a first sacrificial nanosheet over a substrate and forming a first nanosheet stack over the first sacrificial nanosheet. A first cavity is formed under the first nanosheet stack by removing a first portion of the first sacrificial nanosheet. A second cavity is formed under the first nanosheet stack by removing a second portion of the first sacrificial nanosheet, thereby leaving a central support region of the first sacrificial nanosheet under the first nanosheet stack. An isolation material is deposited within the first cavity to form a first isolation region, and the isolation material is also deposited within the second cavity to form a second isolation region. A portion of the first nanosheet stack that is above the central support region of the first sacrificial nanosheet is removed to separate the first nanosheet stack into a second nanosheet stack and a third nanosheet stack. The central support region of the first sacrificial nanosheet is replaced with the isolation material to form a third isolation region. Subsequent to forming the third isolation region, a first nanosheet FET is formed from the second nanosheet stack, and a second nanosheet FET is formed from the third nanosheet stack. The nanosheet FET devices include the first nanosheet FET and the second nanosheet FET, and the bottom isolation region includes the first isolation region, the second isolation region, and the third isolation region.

Embodiments of the invention are directed to an integrated circuit that includes a first nanosheet FET device and a second nanosheet FET device adjacent to the first nanosheet FET device. A bottom isolation region is positioned below the first nanosheet FET device and the second nanosheet FET device. The bottom isolation region includes a first region, a second region and a central region positioned between first region and the second region. A bottom surface of the central region is substantially non-planer with respect to a bottom surface of the first region, and the bottom surface of the central region is substantially non-planer with respect to a bottom surface of the second region.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIGS. 1-11 depict a nanosheet-based structure after various fabrication operations for forming a nanosheet FETs having an improved bottom isolation region in accordance with aspects of the invention, in which:

FIG. 1 depicts a cross-sectional view of a nanosheet-based structure after initial fabrication operations in accordance with aspects of the present invention;

FIG. 2 depicts a cross-sectional view of a nanosheet-based structure after additional fabrication operations in accordance with aspects of the present invention;

FIG. 3 depicts a cross-sectional view of a nanosheet-based structure after additional fabrication operations in accordance with aspects of the present invention;

FIG. 4 depicts a cross-sectional view of a nanosheet-based structure after additional fabrication operations in accordance with aspects of the present invention;

FIG. 5 depicts a cross-sectional view of a nanosheet-based structure after additional fabrication operations in accordance with aspects of the present invention;

FIG. 6 depicts a cross-sectional view of a nanosheet-based structure after additional fabrication operations in accordance with aspects of the present invention;

FIG. 7 depicts a cross-sectional view of a nanosheet-based structure after additional fabrication operations in accordance with aspects of the present invention;

FIG. 8 depicts a cross-sectional view of a nanosheet-based structure after additional fabrication operations in accordance with aspects of the present invention;

FIG. 9 depicts a cross-sectional view of a nanosheet-based structure after additional fabrication operations in accordance with aspects of the present invention;

FIG. 10 depicts a cross-sectional view of a nanosheet-based structure after additional fabrication operations in accordance with aspects of the present invention; and FIG. 11 depicts a cross-sectional view of a nanosheet-based structure after additional fabrication operations in accordance with aspects of the present invention.

DETAILED DESCRIPTION

Figure 1:
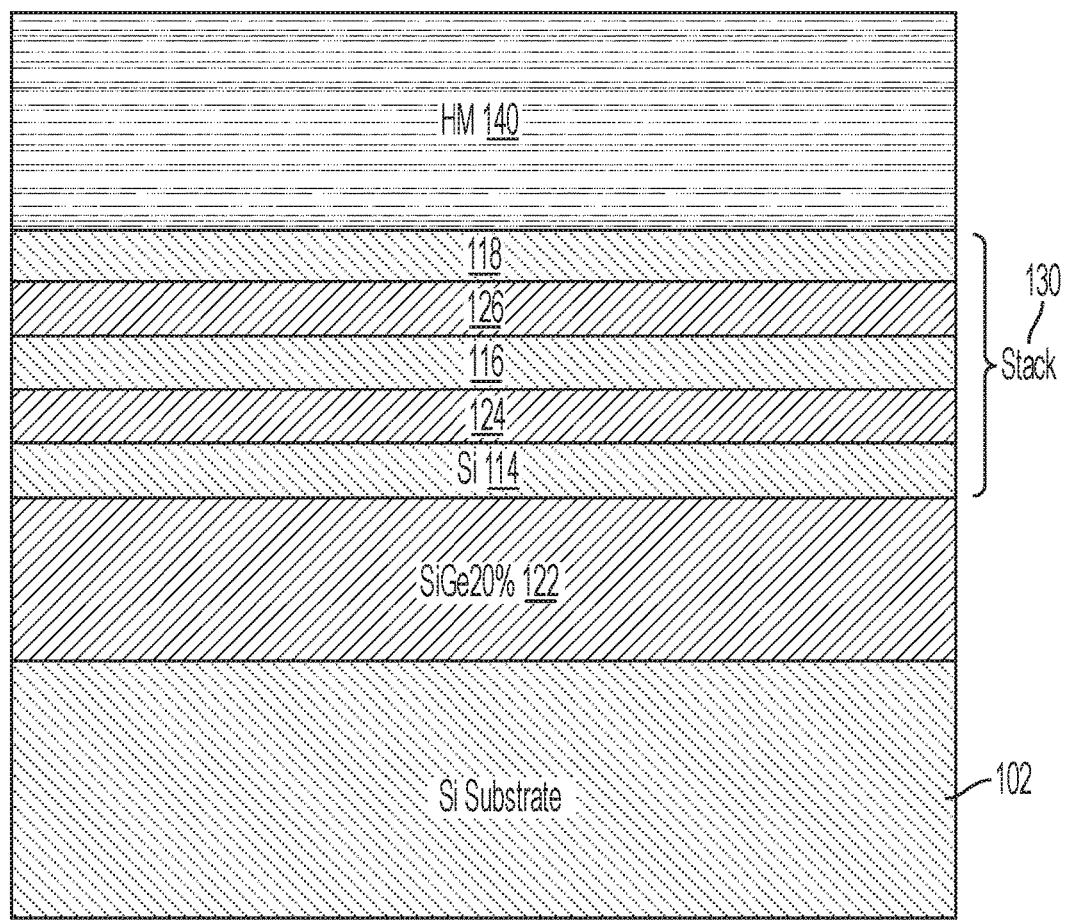

Although this detailed description includes examples of how aspects of the invention can be implemented to form improved bottom isolation in an exemplary gate-all-around (GAA) nanosheet FET architecture having silicon (Si) channel nanosheets and SiGe sacrificial nanosheets, implementation of the teachings recited herein are not limited to a particular type of FET structure or combination of materials. Rather, embodiments of the present invention are capable of being implemented in conjunction with any other type of transistor device or material, now known or later developed, wherein it is desirable to provide improved bottom isolation.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a description of technologies that are more specifically relevant to the present invention, transistors are semiconductor devices commonly found in a wide variety of ICs. A transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Typical semiconductor devices are formed using active regions of a wafer. The active regions are defined by isolation regions used to separate and electrically isolate adjacent semiconductor devices. For example, in an IC having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer.

MOSFET-based ICs are fabricated using so-called complementary metal oxide semiconductor (CMOS) fabrication technologies. In general, CMOS is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode.

The wafer footprint of an FET is related to the electrical conductivity of the channel material. If the channel material has a relatively high conductivity, the FET can be made with a correspondingly smaller wafer footprint. A known method of increasing channel conductivity and decreasing FET size is to form the channel as a nanostructure. For example, a so-called gate-all-around (GAA) nanosheet FET is a known architecture for providing a relatively small FET footprint by forming the channel region as a series of nano sheets. In a known GAA configuration, a nanosheet-based FET includes a source region, a drain region and stacked nanosheet channels between the source and drain regions. A gate surrounds the stacked nanosheet channels and regulates electron flow through the nanosheet channels between the source and drain regions. GAA nanosheet FETs are fabricated by forming alternating layers of channel nanosheets and sacrificial nanosheets. The sacrificial nanosheets are released from the channel nanosheets before the FET device is finalized. For n-type FETs, the channel nanosheets are typically silicon (Si) and the sacrificial nanosheets are typically silicon germanium (SiGe). For p-type FETs, the channel nanosheets can be SiGe and the sacrificial nanosheets can be Si. In some implementations, the channel nanosheet of a p-type FET can be SiGe or Si, and the sacrificial nanosheets can be Si or SiGe. Forming the GAA nanosheets from alternating layers of channel nanosheets formed from a first type of semiconductor material (e.g., Si for n-type FETs, and SiGe for p-type FETs) and sacrificial nanosheets formed from a second type of semiconductor material (e.g., SiGe for n-type FETs, and Si for p-type FETs) provides superior channel electrostatics control, which is necessary for continuously scaling gate lengths down to seven (7) nanometer CMOS technology and below. The use of multiple layered SiGe/Si sacrificial/channel nanosheets (or Si/SiGe sacrificial/channel nanosheets) to form the channel regions in GAA FET semiconductor devices provides desirable device characteristics, including the introduction of strain at the interface between SiGe and Si.

Although nanosheet channel FET architectures provide increased device density over planar FET architectures, there are still challenges when attempting to fabricate nanosheet FETs that provide the performance characteristics required for a particular application. For example, to reduce the leakage and parasitic capacitance, it is necessary to provide nanosheet FETs with dielectric isolation. Theoretically, such dielectric isolation would be provided by forming a dielectric layer (e.g., SiO2) over the substrate then forming the initial stack of alternating channel nanosheets and sacrificial nanosheets over the dielectric layer. However, this approach is not practical because the semiconductor materials (e.g., Si, SiGe) from which the stack of alternating channel and sacrificial nanosheets are formed cannot be epitaxially grown at high quality levels (e.g., as single crystal material) from the dielectric layer. Accordingly, it is desirable to provide improved fabrication methods and resulting structure for nanosheet FETs having a dielectric isolation region.

Turning now to an overview of aspects of the invention, embodiments of the invention provide fabrication methods and resulting structures for nano sheet FETs having an improved dielectric isolation layer positioned beneath the nanosheet FETs. In aspects of the invention, a first sacrificial nanosheet is formed over a substrate, and a first nanosheet stack is formed over the first sacrificial nanosheet. The first nanosheet stack is formed from alternating layers of channel nanosheets and sacrificial nanosheets. In aspects of the invention, the substrate, the first sacrificial nanosheet, and the first nanosheet stack are formed from semiconductor materials that can be epitaxially grown, one from the other, as single crystal semiconductor layers/regions. For example, the substrate can be Si, the first sacrificial nanosheet can be SiGe, and the first nanosheet stack can be alternating layers of Si (e.g., the channel nanosheets) and SiGe (e.g., the sacrificial nanosheets).

In aspects of the invention, the first sacrificial nanosheet functions as a placeholder for where the final dielectric isolation layer will be formed. In aspects of the invention, selected surface areas of the first sacrificial nanosheet are exposed, and sections of the first sacrificial nanosheet are removed such that a central support region of the first sacrificial nanosheet remains underneath the first nanosheet stack. Removing sections of the first sacrificial nanosheet leaves "first region" cavities that extend underneath portions of the first nanosheet stack. In aspects of the invention, a dielectric material is deposited within the first region cavities to form first region(s) of the final dielectric isolation layer. At this fabrication stage, the first nanosheet stack is supported by the first region(s) of the final dielectric isolation layer and the central support region of the first sacrificial nanosheet.

In aspects of the invention, the central support region of the first sacrificial nanosheet is replaced with a dielectric material to form a central region of the final dielectric isolation layer. In aspects of the invention, the central support region of the first sacrificial nanosheet is removed, thereby creating a central support region cavity. In aspects of the invention, the central support region of the first sacrificial nanosheet can be removed by exposing a top surface of the central support region of the first sacrificial nanosheet. In aspects of the invention, the top surface of the central support region of the first sacrificial nanosheet is exposed by removing a portion of the first nanosheet stack that is over the central support region of the first sacrificial nanosheet. The removed portion of the first nanosheet stack separates the first nanosheet stack into a second nanosheet stack and an adjacent third nanosheet stack. In aspects of the invention, downstream fabrication operations will be applied to the second and third nanosheet stacks to form adjacent first and second nanosheet FETs.

A width dimension (W1) of the removed portion of the first nanosheet stack is selected to provide the required space between the second nanosheets stack of the first nanosheet FET and the third nanosheet stack of the second nanosheet FET. Additionally, a width dimension (W2) of the central support region of the first sacrificial nanosheet layer is selected to be equal to or less than W1 in order to ensure that the entire top surface of the central support region of the first sacrificial nanosheet is exposed when the portion of the first nanosheet stack that is over the central support region of the first sacrificial nanosheet is removed. The central support region of the first sacrificial nanosheet can be removed using any suitable removal process, including, for example, applying a directional etch (e.g., a directional RIE) through the exposed top surface of the central support region of the first sacrificial nanosheet layer. At this fabrication stage, the second nanosheet stack is supported by at least one of the first region(s) of the final dielectric isolation layer, and the third nanosheet stack is supported by at least one of the first region(s) of the final dielectric isolation layer. In aspects of the invention, the central support region cavity is filled with a dielectric material to complete the final dielectric isolation layer. Accordingly, the final dielectric isolation layer includes the first region(s) and the central region.

In aspects of the invention, the dielectric material deposited into the central support region cavity can be the same as or different from the dielectric material deposited into the first region cavities.

In aspects of the invention, a depth of the directional etch used to remove the central support region of the first sacrificial nanosheet is sufficient to ensure that the entire central support region of the first sacrificial nanosheet is removed. Hence, the central region of the final dielectric isolation layer extends deeper into the substrate than the first region(s) of the final dielectric isolation layer.

Accordingly, aspects of the invention provide improved fabrication methods and resulting structures configured to create a dielectric isolation for nanosheet FETs at a very early stage of the fabrication method, without using additional photo-masks, and using fabrication operations that are compatible with self-aligned double patterning processes.

Figure 8:
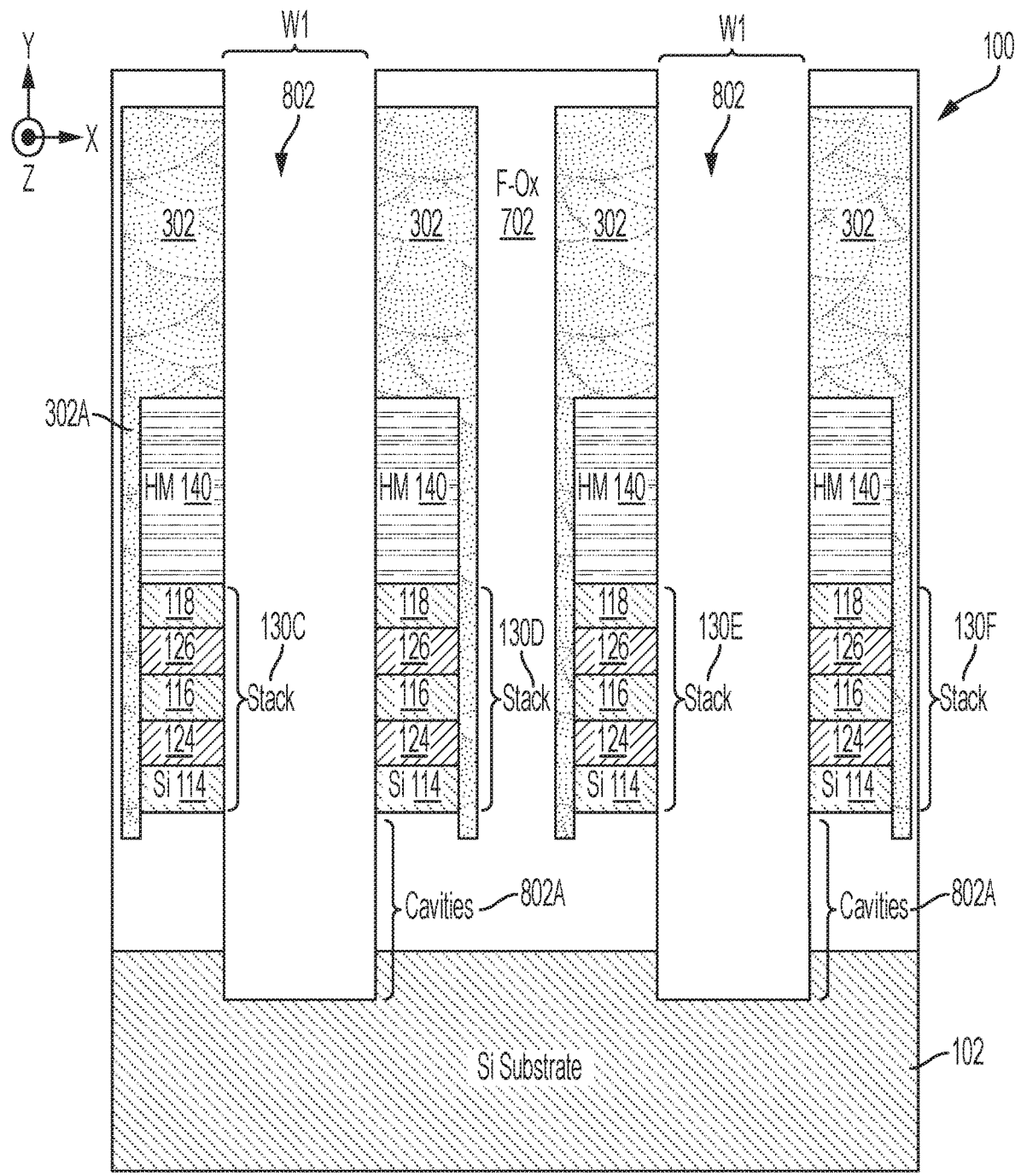
Figure 9:
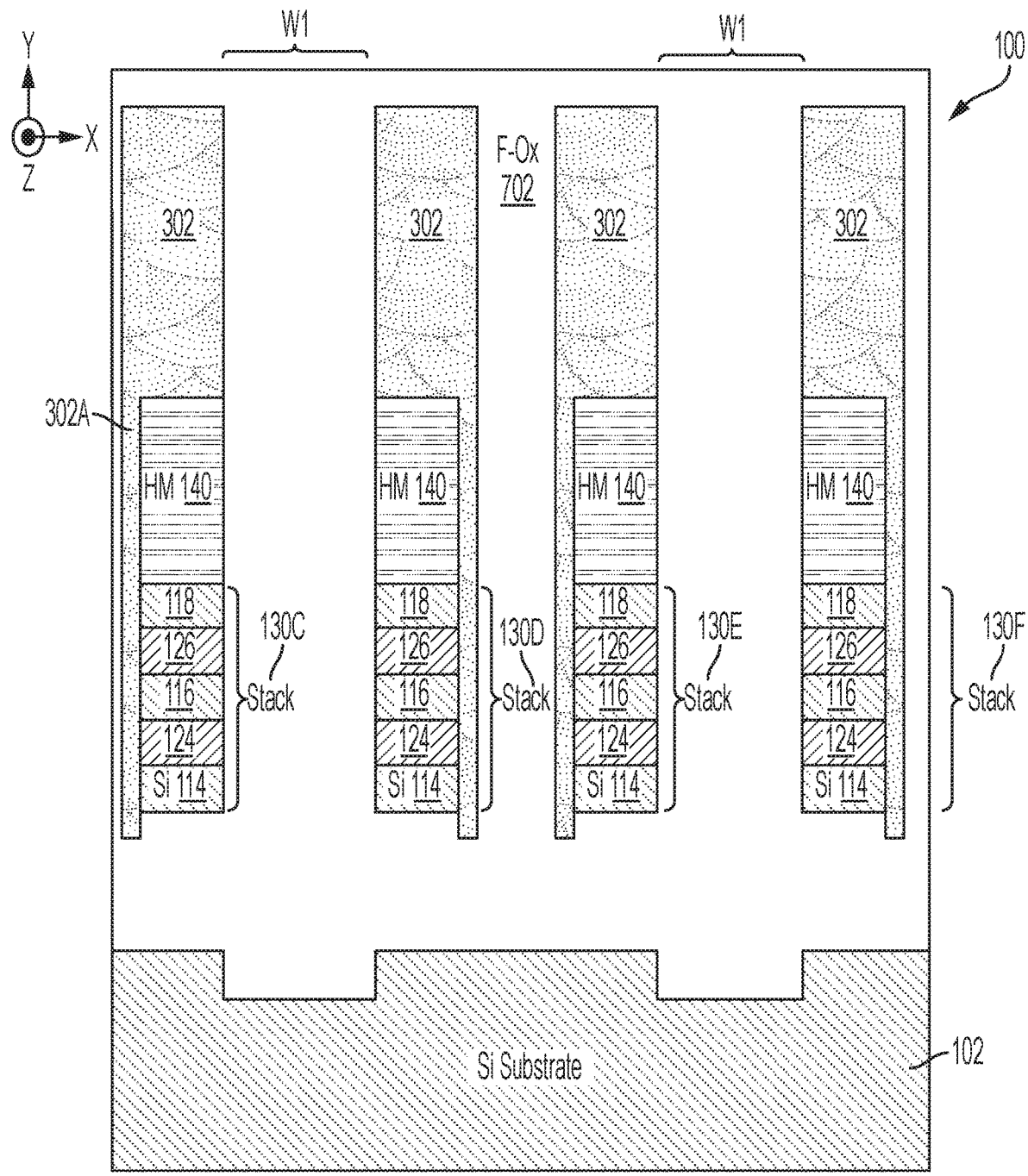
Figure 10:
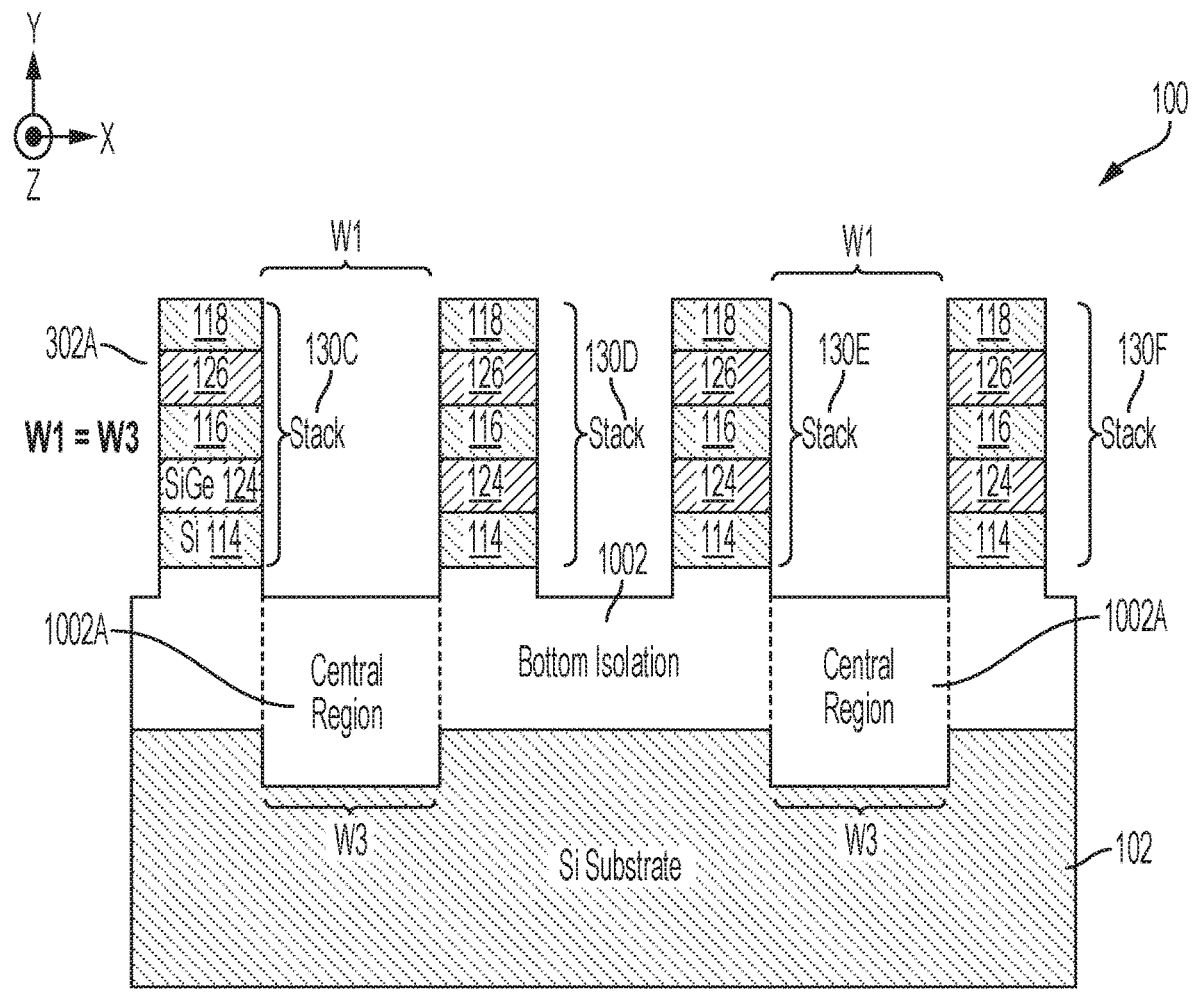

Turning now to a more detailed description of fabrication operations and resulting structures according to aspects of the invention, FIGS. 1-11 depict a nanosheet-based structure 100 after various fabrication operations for forming nanosheet FETs having a bottom isolation layer 1002 (shown in FIG. 10). For ease of illustration, the fabrication operations depicted in FIGS. 1-11 will be described in the context of forming four nanosheet stacks 130C, 130D, 130E, 130F (shown in FIG. 9), it is intended that fabrication operations described herein apply equally to the fabrication of any number of nanosheet stacks.

Although the diagrams depicted in FIGS. 1-11 are two-dimensional, it is understood that the structures depicted in FIGS. 1-11 are three-dimensional. The x/y/z diagram depicted in the figures is to represent that the various elements depicted in FIGS. 1-11 extend along a first axis (e.g., x-axis) to define width (or lateral) dimensions, extend along a second axis (e.g., y-axis) perpendicular to the x-axis to define height (or vertical) dimensions, and extend along a third axis (e.g., z-axis) perpendicular to the first axis and the second axis to define depth dimensions.

FIG. 1 depicts a cross-sectional view of the nanosheet-based structure 100 after initial fabrication operations in accordance with aspects of the present invention. As shown in FIG. 1, a relatively thick first sacrificial nanosheet 122 is formed over a substrate 102, and a nanosheet stack 130 is formed over the first sacrificial nanosheet 122. The nanosheet stack 130 includes an alternating series of Si nanosheet layers 114, 116, 118 and SiGe sacrificial nanosheet layers 124, 126. In accordance with aspects of the invention, the first sacrificial nanosheet 122 is epitaxially grown from the substrate 102, and the nanosheet stack 130 is epitaxially grown from the first sacrificial nanosheet 122. The alternating layers 114, 124, 116, 126, 118 of the nanosheet stack 130 are formed by epitaxially growing one layer and then the next until the desired number and desired thicknesses of the nanosheet layers are achieved. Although five alternating layers 114, 124, 116, 126, 118 are depicted in the figures, any number of alternating layers can be provided. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surfaces, and generally do not deposit material on exposed surfaces, such as silicon dioxide or silicon nitride surfaces.

In some embodiments of the invention, the first sacrificial nanosheet 122 can be SiGe 20%. The notation "SiGe 20%" is used to indicate that 20% of the SiGe material is Ge and 80% of the SiGe material is Si. In some embodiments of the invention, the Ge percentage in the SiGe first sacrificial nanosheet 122 can range from about 20% to about 35%. In some embodiments of the invention, the Ge percentage in the SiGe sacrificial nanosheet layers 124, 126 can range from about 20% to about 35%. In some embodiments of the invention, the Ge percentage in the first sacrificial nanosheet 122 can be the same as the Ge percentage in the sacrificial nanosheet layers 124, 126. In some embodiments of the invention, the Ge percentage in the first sacrificial nanosheet 122 can be different than the Ge percentage in the sacrificial nanosheet layers 124, 126. In some embodiments of the invention, the Ge percentage in the first sacrificial nanosheet 122 can higher than the Ge percentage in the sacrificial nanosheet layers 124, 126. The SiGe nanosheet layers 122, 124, 126 can be SiGe 25%.

As shown in FIG. 1, a hard mask (HM) layer 140 is deposited over the nanosheet stack 130. Any suitable deposition process (e.g., ALD) can be used to deposit the hard mask 140. In accordance with aspects of the invention, the hard mask is used to facilitate downstream patterning processes. The hard mask 140 can be any suitable dielectric, including but not limited to SiN.

Figure 2:
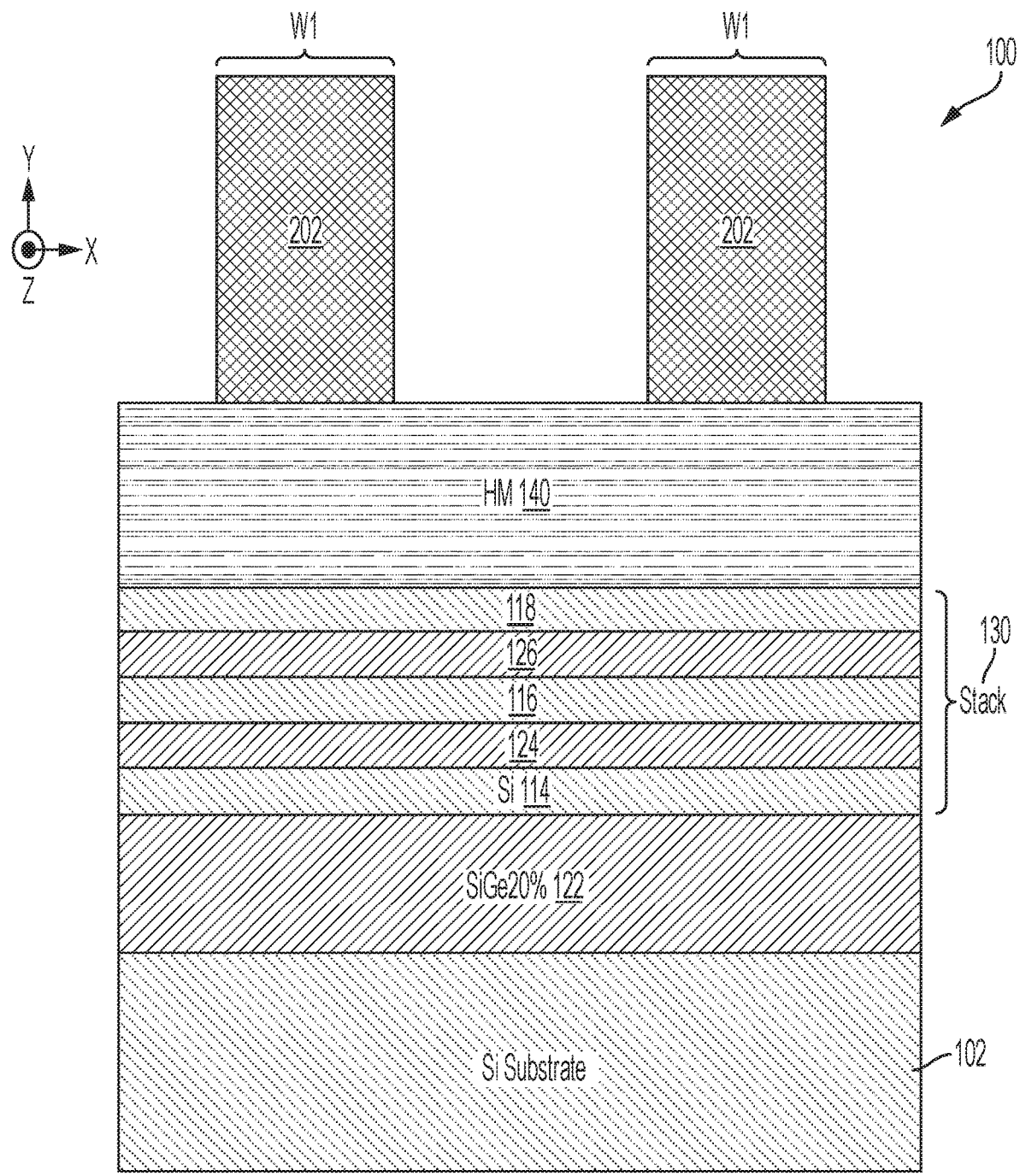

In FIG. 2, known fabrication operations have been used to form sacrificial mandrels 202 over the hard mask 140. The sacrificial mandrels 202 can be formed from amorphous silicon (a-Si). In aspects of the invention, the mandrels 202 have a predetermined width dimension W1. The known fabrication operations used to form the sacrificial mandrels 202 can include depositing a layer of a-Si (not shown) over the nanosheet stack 130 and planarizing the a-Si to a desired level. A patterned hard mask (e.g., a nitride) (not shown) is deposited over the planarized a-Si. The pattern of the hard mask defines the footprints of the mandrels 202. An etch (e.g., an RIE) or a recess is applied to remove the portions of the a-Si layer that are not covered by the patterned hard mask to form the mandrels 202 over the nanosheet stack 130.

Figure 3:
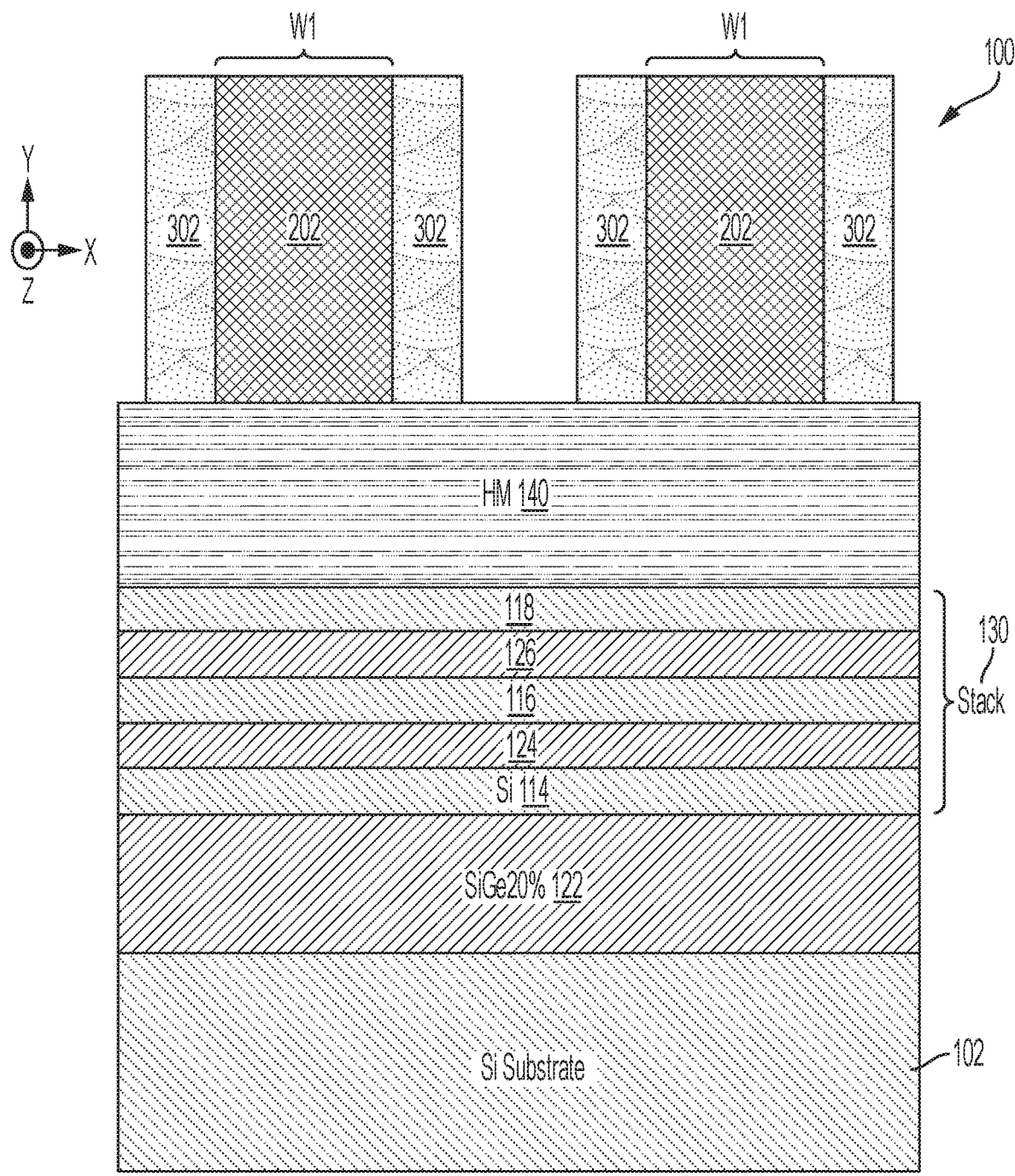

In FIG. 3, known semiconductor fabrication operations are used to form offset spacers 302 on sidewalls of the sacrificial mandrels 202. In embodiments of the invention, the offset spacers 302 can be formed by a conformal deposition of a dielectric material (e.g., a nitride) followed by a directional etch (e.g., RIE). In some embodiments of the invention, the offset spacers 302 can include silicon oxide, silicon nitride, silicon oxynitride, SiBCN, SiOCN, SiOC, or any suitable combination of those materials.

Figure 4:
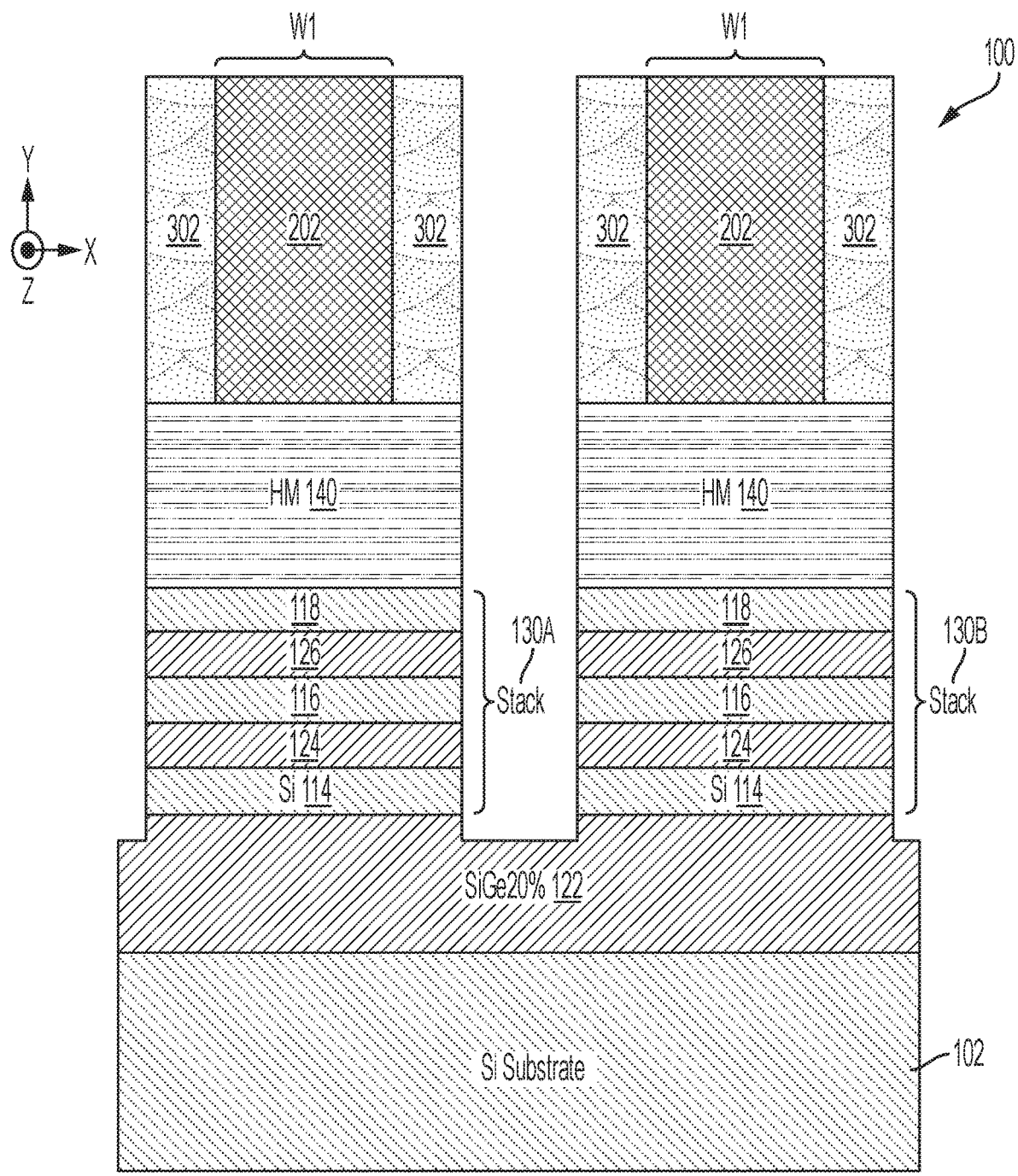

In FIG. 4, the portions of the hard mask 140 and the nanosheet stack 130 that are not covered by the offset spacers 302 and the mandrels 202 are etched, thereby forming an elongated fin-shaped stack 130A having the mandrel 202 and spacers 302 formed over the top thereof, along with an elongated fin-shaped stack 130B having the mandrel 202 and spacers 302 formed over the top thereof. The etch applied in FIG. 4 extends into the first sacrificial nanosheet 122 and exposes top surfaces of the first sacrificial nanosheet 122.

Figure 5:
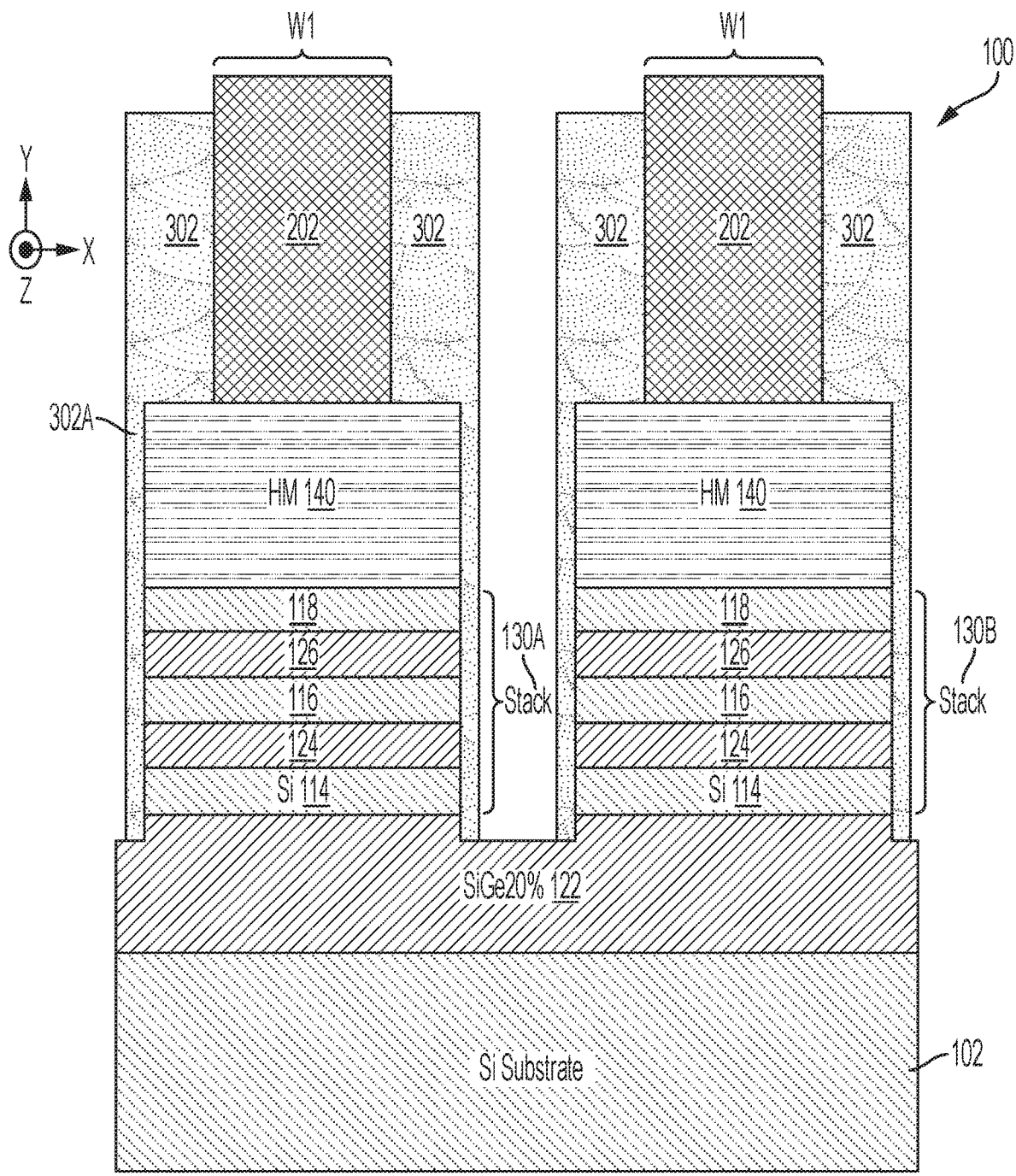

In FIG. 5, known fabrication operations have been used to form protective liners 302A are formed around the nanosheet stacks 130A, 130B. In embodiments of the invention, the protective liners 302A can be formed by a conformal deposition of a dielectric material (e.g., a nitride) followed by a directional etch (e.g., RIE). In aspects of the invention, the protective liners 302A are the same material as the offset spacers 302.

Figure 6:
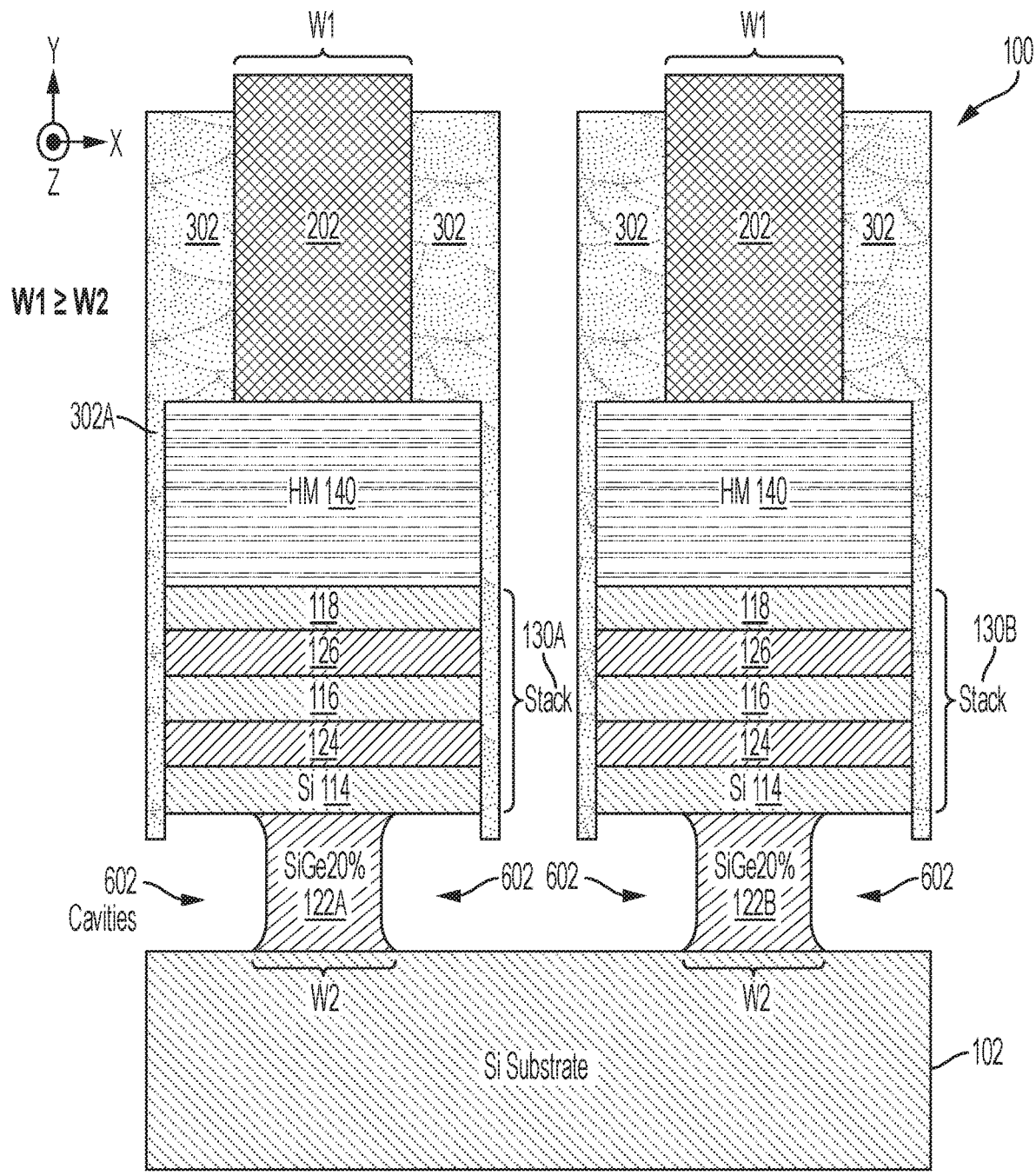

In FIG. 6, known fabrication operations have been used to remove regions of the first sacrificial nanosheet 122, thereby forming cavities 602 in the spaces that were occupied by the removed regions of the first sacrificial nanosheet 122. In aspects of the invention, regions of the first sacrificial nanosheet 122 can be removed using a so-called "pull-back" process to pull the first sacrificial nanosheet 122 back an initial pull-back distance such that central support regions 122A, 122B of the first sacrificial nanosheet 122 remains underneath each of the mandrels 202. In accordance with aspects of the invention, the central support regions 122A, 122B are each sufficiently aligned with one of the mandrels 202 such that each of the central support regions 122A, 122B is completely underneath one of the mandrels 202, and such that W1 is greater than or equal to a width dimension (W2) of each of the central support regions 122A, 122B. In embodiments of the invention, the pull-back process includes a hydrogen chloride (HCL) gas isotropic etch process, which etches the material (e.g., SiGe) of the first sacrificial nanosheet 122 without attacking the material (e.g., SiN) of the protective liner 302A or the material (e.g., Si) of the bottommost channel nanosheet layers 114. At this stage of the fabrication operations, the central support region 122A supports the nanosheet stack 130A, and the central support region 122B supports the nanosheet stack 130B.

Figure 7:
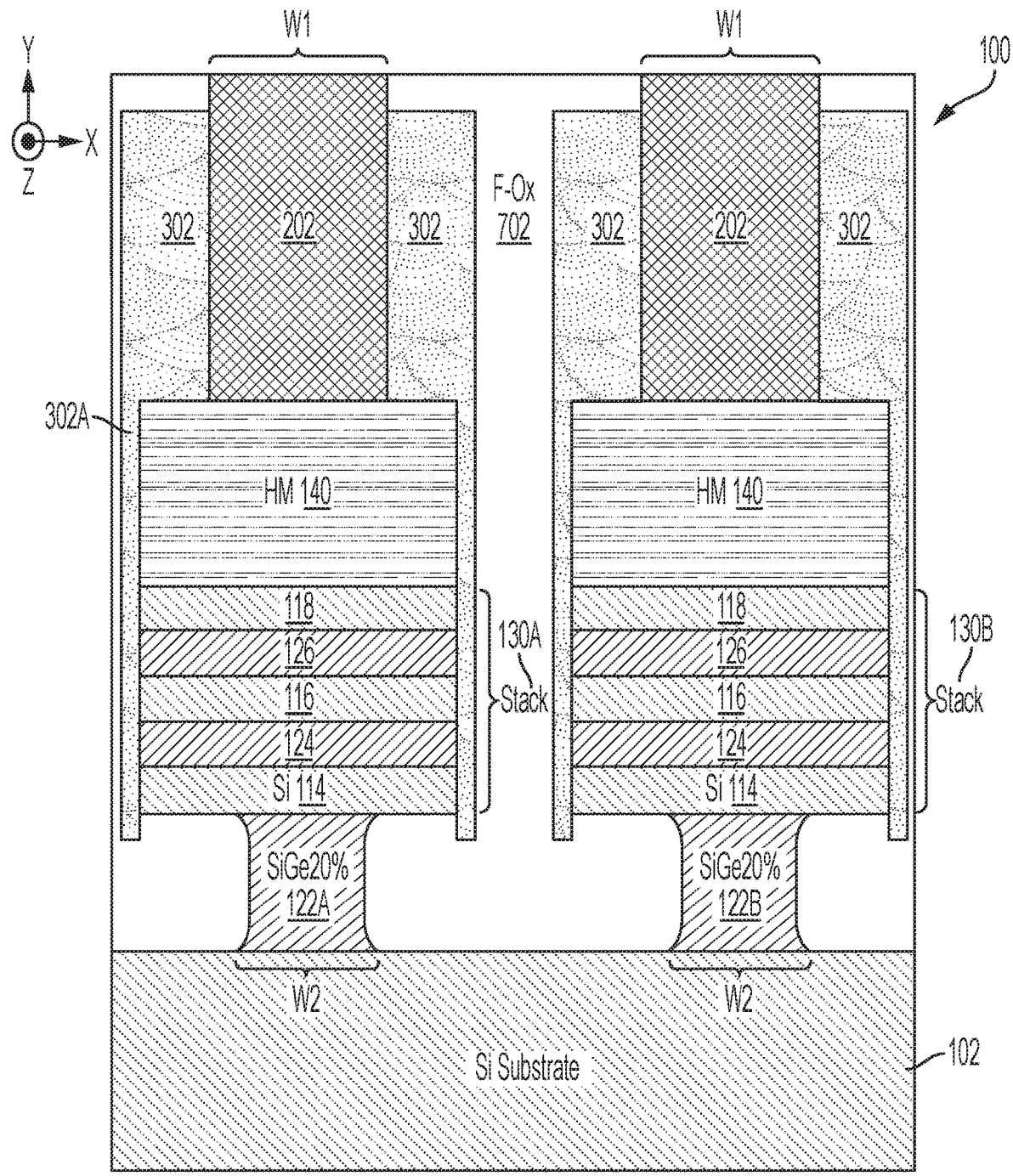

In FIG. 7, known fabrication operations have been used to deposit, planarize (e.g., using CMP), and steam anneal a flowable (or filler) oxide (F-Ox) 720 (e.g., SiO2) over the nanosheet-based structure 100. The steam anneal densifies the film and further narrows each of the central isolation regions 122A, 122B, thereby further reducing W2. In aspects of the invention, the flowable oxide 720 fills in open regions of the structure 100, including specifically the cavities 602 (shown in FIG. 6). In aspects of the invention, the flowable oxide 702 is the material from which at least a portion of the final bottom isolation layer 1002 (shown in FIG. 10) will be formed. In embodiments of the invention, the flowable material 702 need not be an oxide but can be other types of flowable dielectric films. For example, the dielectric film 702 can be silicon nitride, silicon oxynitride, silicon carbide, or silicon oxycarbide.

The CMP applied in FIG. 7 polished the exposed top surface of the nanosheet-based structure 100 to expose top surfaces of the mandrels 202. In FIG. 8, known fabrication operation have been used to remove the mandrels 202 using, for example, a known etching process, e.g., RIE or chemical oxide removal (COR), is applied to the exposed top surfaces of the mandrels 202. Additionally, known semiconductor fabrication operations have been used to remove the portions of the hard masks 140 and the nanosheet stacks 122A, 122B that are not covered by the offset spacers 302 and the protective liners 302A, thereby separating the nanosheet stack 130A into a nanosheet stack 130C and a nanosheet stack 130D, and also separating the nanosheet stack 130B into a nanosheet stack 130E and a nanosheet stack 130F. Removing the portions of the hard masks 140 and the nanosheet stacks 122A, 122B that are not covered by the offset spacers 302 and the protective liners 302A also exposes top surfaces of the central support regions 122A, 122B. In accordance with aspects of the invention, the central support regions 122A, 122B are removed. The central support regions 122A, 122B can be removed by applying a selective etch (e.g., a hydrochloric acid (HCl)) through the exposed top surfaces of the central support regions 122A, 122B. To ensure that the central support regions 122A, 122B are completely removed, the selective etch extends into the underlying substrate 102. The above-described etch operations applied to the structure 100 result in the formation of cavities 802 each having a sub-cavity 802A.

In FIG. 9, known fabrication operations have been used to deposit more of the flowable oxide 720 over the nanosheet-based structure 100 to fill in the cavities 802 and the sub-cavities 802A. In aspects of the invention, the flowable oxide 720 fills in open regions of the structure 100, including specifically the cavities 602 (shown in FIG. 6). In aspects of the invention, the flowable dielectric film used to fill in the cavities 802 and the sub-cavities 802A can be the same type of dielectric film as the flowable oxide 702 or a different type of dielectric film than the flowable oxide 702. In aspects of the invention, after deposition of the additional flowable oxide 702 is planarized (e.g., using CMP).

In FIG. 10, known fabrication operations have been used to recess the flowable oxide 702 to the level shown in FIG. 10, thereby forming the final bottom isolation layer 1002. Known fabrication operations have also been used to remove the hard masks 140, the offset spacers 302, and the protective liners 302A. In accordance with aspects of the invention, the bottom isolation layer 1002 include a central region 1002A having a width dimension W3 that is substantially the same as W1. In aspects of the invention, the central region 1002A extends deeper into the substrate 102 than the bottom isolation layer 1002. In some aspects of the invention, the dielectric material of the central region 1002A can be the same as the dielectric material of the bottom isolation layer 1002. In some aspects of the invention, the dielectric material of the central region 1002A can be a different type of dielectric material than the dielectric material of the bottom isolation layer 1002.

Figure 11:
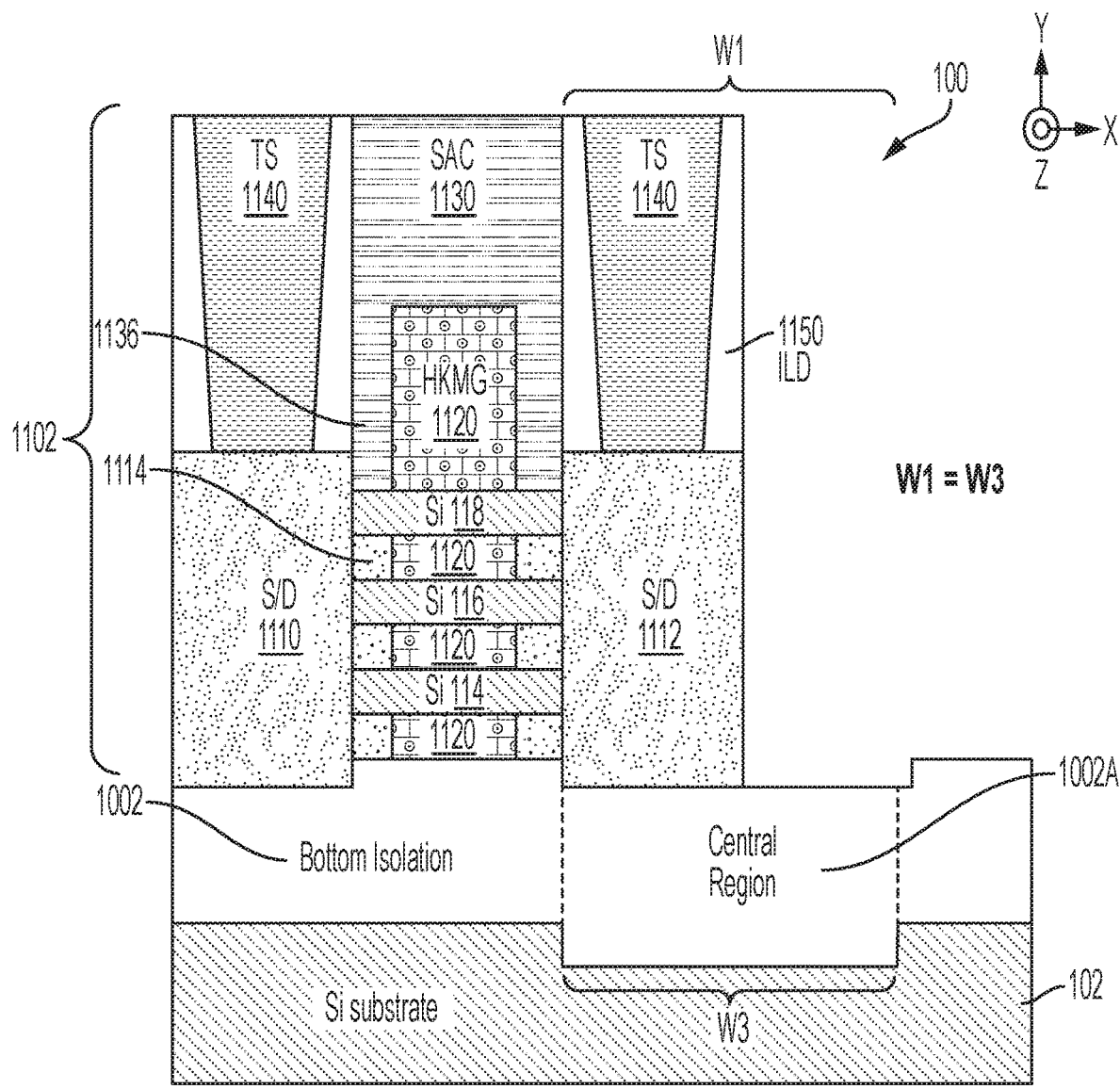

In FIG. 11, known fabrication operations have been used to form the nanosheet-based structure 100 shown in FIGS. 1-10 into nanosheet FETs 1102 having the bottom isolation layer 1002. For ease of illustration, only one of the nanosheet FETs 1002 is illustrated. As shown in FIG. 11, known fabrication operations have been used to form a dummy gate (not shown) and gate spacers 1136 over and around the elongated fin-shaped nanosheet stack 130C, 130D; form inner spacers 1114; form source or drain (S/D) regions 1110, 1112; deposit an interlayer dielectric (ILD) 1150; remove the sacrificial nanosheet layers 124, 126 and the dummy gate; replace the removed sacrificial nanosheet layers 124, 126 and the dummy gate with a high-k metal gate (HKMG) structure 1120; form a self-aligned cap (SAC) 1130 over the HKMG structure 1120; and form metal plugs 1140 (e.g., a silicide material referred to as "trench silicide" (TS)) in the ILD 1150. The specifics of suitable methods of performing the above-described fabrication operations are well-known in the relevant arts so have been omitted in the interest of brevity.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the detailed description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of performing fabrication operations to form nanosheet field effect transistor (FET) devices having a bottom isolation region under the nanosheet FET devices, wherein the fabrication operations include:
   forming a first sacrificial nanosheet over a substrate;
   forming a first nanosheet stack over the first sacrificial nanosheet;
   forming a cavity under the first nanosheet stack by removing at least a first portion of the first sacrificial nanosheet and leaving a second portion of the first sacrificial nanosheet;
   depositing an isolation material within the cavity to form a first isolation region;
   removing a portion of the first nanosheet stack that is above the second portion of the first sacrificial nanosheet to separate the first nanosheet stack into a second nanosheet stack and a third nanosheet stack;
   replacing the second portion of the first sacrificial nanosheet with the isolation material to form a second isolation region;
   forming a first nanosheet FET from the second nanosheet stack; and
   forming a second nanosheet FET from the third nanosheet stack;
   wherein the nanosheet FET devices comprise the first nanosheet FET and the second nanosheet FET; and
   wherein the bottom isolation region under the nanosheet FET devices comprises the first isolation region and the second isolation region.

2. The method of claim 1, wherein:
   a space between the second nanosheet stack and the third nanosheet stack comprises a first width dimension; and
   the first width dimension is greater than or equal to a width dimension of the second portion of the first sacrificial nanosheet.

3. The method of claim 1, wherein removing the first portion of the first sacrificial nanosheet comprises:
   exposing a surface of the first sacrificial nanosheet; and
   applying an etch operation through the exposed surface of the first sacrificial nanosheet.

4. The method of claim 1, wherein the first nanosheet stack comprises alternating layers of channel nanosheets and sacrificial nanosheets.

5. The method of claim 4, wherein a bottommost one of the alternating layers comprises a bottommost channel nanosheet.

6. The method of claim 5 wherein removing the first portion of the first sacrificial nanosheet comprises:
   exposing a surface of the first sacrificial nanosheet; and
   applying an etch operation through the exposed surface of the first sacrificial nanosheet;
   wherein the etch operation is selective to the first sacrificial nanosheet over the bottommost channel nanosheet.

7. The method of claim 1, wherein the second portion of the first sacrificial nanosheet provides physical support to the first nanosheet stack.

8. The method of claim 1, wherein the first isolation region provides physical support to the first nanosheet stack.

9. The method of claim 1, wherein removing the portion of the first nanosheet stack exposes a surface of the second portion of the first sacrificial nanosheet.

10. The method of claim 9, wherein replacing the second portion of the first sacrificial nanosheet with the isolation material comprises:
    removing the second portion of the first sacrificial nanosheet by applying an etch operation through the exposed surface of the second portion of the first sacrificial nanosheet; and
    depositing the isolation material in a space that was occupied by the second portion of the first sacrificial nanosheet.

11. A method of performing fabrication operations to form nanosheet field effect transistor (FET) devices having a bottom isolation region under the nanosheet FET devices, wherein the fabrication operations include:
    forming a first sacrificial nanosheet over a substrate;
    forming a first nanosheet stack over the first sacrificial nanosheet;
    forming a first cavity under the first nanosheet stack by removing a first portion of the first sacrificial nanosheet;
    forming a second cavity under the first nanosheet stack by removing a second portion of the first sacrificial nanosheet, thereby leaving a central support region of the first sacrificial nanosheet under the first nanosheet stack;
    depositing an isolation material within the first cavity to form a first isolation region;
    depositing the isolation material within the second cavity to form a second isolation region;
    removing a portion of the first nanosheet stack that is above the central support region of the first sacrificial nanosheet to separate the first nanosheet stack into a second nanosheet stack and a third nanosheet stack;
    replacing the central support region of the first sacrificial nanosheet with the isolation material to form a third isolation region;
    subsequent to forming the third isolation region, forming a first nanosheet FET from the second nanosheet stack; and
    subsequent to forming the third isolation region, forming a second nanosheet FET from the third nanosheet stack;
    wherein the nanosheet FET devices comprise the first nanosheet FET and the second nanosheet FET; and
    wherein the bottom isolation region under the nanosheet FET devices comprises the first isolation region, the second isolation region, and the third isolation region.

12. The method of claim 11, wherein:
    a space between the second nanosheet stack and the third nanosheet stack comprises a first width dimension; and
    the first width dimension is greater than or equal to a width dimension of the central support region of the first sacrificial nanosheet.

13. The method of claim 11, wherein:
    removing the first portion of the first sacrificial nanosheet comprises:
       exposing a first surface of the first sacrificial nanosheet; and
       applying an etch operation through the exposed first surface of the first sacrificial nanosheet; and removing the second portion of the first sacrificial nanosheet comprises:
  exposing a second surface of the first sacrificial nanosheet; and
  applying an etch operation through the exposed second surface of the first sacrificial nanosheet.

14. The method of claim 11, wherein:
the first nanosheet stack comprises alternating layers of channel nanosheets and sacrificial nanosheets;
a bottommost one of the alternating layers comprises a bottommost channel nanosheet; and
removing the first portion and the second portion of the first sacrificial nanosheet comprises:
  exposing a first surface of the first sacrificial nano sheet;
  exposing a second surface of the first sacrificial nanosheet; and
  applying an etch operation through the exposed first surface and the exposed second surface of the first sacrificial nanosheet;
  wherein the etch operation is selective to the first sacrificial nanosheet over the bottommost channel nanosheet.

15. The method of claim 11, wherein the central support region of the first sacrificial nanosheet provides physical support to the first nanosheet stack.

16. The method of claim 11, wherein the first isolation region and the second isolation region provide physical support to the first nanosheet stack.

17. The method of claim 11, wherein:
removing the portion of the first nanosheet stack exposes a surface of the central support region of the first sacrificial nanosheet; and
replacing the central support region of the first sacrificial nanosheet with the isolation material comprises:
  removing the central support region of the first sacrificial nanosheet by applying an etch operation through the exposed surface of the central support region of the first sacrificial nanosheet; and
  depositing the isolation material in a space that was occupied by the central support region of the first sacrificial nanosheet.

* * * * *